(12) United States Patent
Liao

(10) Patent No.: US 10,910,530 B2
(45) Date of Patent: Feb. 2, 2021

(54) LED CHIP MOUNTING METHOD AND DEVICE

(71) Applicant: ASTI GLOBAL INC., TAIWAN, Changhua County (TW)

(72) Inventor: Chien-Shou Liao, New Taipei (TW)

(73) Assignee: ASTI GLOBAL INC., TAIWAN, Changhua County (TW)

( * ) Notice: Subject to any disclaimer, the term of this patent is extended or adjusted under 35 U.S.C. 154(b) by 0 days.

(21) Appl. No.: 16/384,267

(22) Filed: Apr. 15, 2019

(65) Prior Publication Data

US 2020/0135989 A1    Apr. 30, 2020

(30) Foreign Application Priority Data

Oct. 31, 2018   (TW) .............. 107138610 A

(51) Int. Cl.
```
H01L 33/52      (2010.01)
H01L 33/62      (2010.01)
H01L 23/31      (2006.01)
H05B 45/00      (2020.01)
```
(52) U.S. Cl.
CPC .......... *H01L 33/52* (2013.01); *H01L 23/3114* (2013.01); *H01L 33/62* (2013.01); *H05B 45/00* (2020.01); *H01L 2224/77261* (2013.01); *H01L 2224/78261* (2013.01)

(58) Field of Classification Search
CPC ..... H01L 33/52; H01L 33/62; H01L 23/3114; H01L 33/007; H01L 21/52; H01L 2924/151; H01L 2933/0066; H01L 21/67144; H01L 2224/81; H05B 45/00
See application file for complete search history.

(56) References Cited

U.S. PATENT DOCUMENTS

| | | | |
|---|---|---|---|
| 2015/0229107 A1* | 8/2015 | McLaurin | H01S 5/22 372/45.01 |
| 2015/0294951 A1* | 10/2015 | Smits | H01L 23/49816 438/119 |
| 2018/0032852 A1* | 2/2018 | Foucault | H01L 24/81 |
| 2019/0058099 A1* | 2/2019 | Oh | H01L 33/36 |
| 2019/0097387 A1* | 3/2019 | Tsai | H01L 33/483 |

* cited by examiner

*Primary Examiner* — Yasser A Abdelaziez
(74) *Attorney, Agent, or Firm* — Li & Cai Intellectual Property (USA) Office

(57) ABSTRACT

An LED mounted method includes: providing a circuit substrate having a plurality of conductive pads; through a pick and place module, disposing a plurality of conductors on the conductive pads; disposing a plurality of LED chips on the circuit substrate, with each LED chip being disposed on at least two conductors; projecting a laser source generated by a laser generation module to each LED chip so that the laser source passes through the LED chip and is projected onto at least two conductors; and curing the conductor disposed between the LED chip and the circuit substrate by irradiation of the laser source so that the LED chip is mounted on the circuit substrate.

6 Claims, 8 Drawing Sheets

LED CHIP MOUNTING METHOD AND DEVICE

This application claims the benefit of priority to Taiwan Patent Application No. 107138610, filed on Oct. 31, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a chip mounting method and device, and more particularly to an LED chip mounting method and device.

BACKGROUND OF THE DISCLOSURE

Light-emitting diodes (LEDs) are widely used nowadays due to excellent light quality and high luminous efficiency. Generally, in order to make a display device using a light-emitting diode as a light-emitting element have better color performance, the related art adopts a combination of red, green, and blue light-emitting diode chips to form a full-color light-emitting diode display device. The full-color light-emitting diode display device can respectively emit three colors of red, green and blue light through three kinds of red, green and blue light-emitting diode chips, and then a full color light can be formed to display related information after the mixing of light. However, in the related art, a substrate carrying the LED chips needs to be first removed in process of mounting the LED chips on a circuit substrate.

SUMMARY OF THE DISCLOSURE

In response to the above-referenced technical inadequacies, the present disclosure provides an LED chip mounting method and device.

In one aspect, the present disclosure provides an LED chip mounting method, including: firstly, providing a circuit substrate including a plurality of conductive pads; secondly, disposing a plurality of conductors on the conductive pads, respectively; then, disposing a plurality of LED chips on the circuit substrate, with each of the LED chips being disposed on the at least two conductors; next, projecting a laser source generated by a laser generation module to each of the LED chips so that the laser source passes through the LED chip and is projected onto the at least two conductors; finally, curing the conductor disposed between the LED chip and the circuit substrate by irradiation of the laser source so that the LED chips are mounted to the circuit substrate.

In one aspect, the present disclosure provides an LED mounted device, including a carrier module, a pick and place module, and a laser generation module. The carrier module is used to carry a circuit substrate including a plurality of conductive pads, and the conductors are respectively disposed on the conductive pads. The pick and place module is for disposing a plurality of LED chips on the circuit substrate, and each of the LED chips is disposed on the at least two conductors. The laser source generated by the laser generation module is directed to each of the LED chips so that the laser source passes through the LED chip and is projected onto the at least two conductors. The carrier module, the pick and place module, and the laser generation module are adjacent to each other and disposed on the same production line. The conductor disposed between the LED chip and the circuit substrate is cured by irradiation of the laser source so that the LED chip is mounted on the circuit substrate.

In one aspect, the present disclosure provides another LED mounted device, including a carrier module, a pick and place module, and a laser generation module. The carrier module, the pick and place module and the laser generation module are disposed on the same production line, and a laser source generated by the laser generation module is directed to an LED chip, so that the laser source passes through the LED chip and is projected onto the at least two conductors. The conductor is cured by irradiation of the laser source so that the LED chip is mounted on the circuit substrate.

Therefore, one of the beneficial effects of the present disclosure is that the LED chip mounting method provided by the present disclosure has the technical features of "providing a circuit substrate including a plurality of conductive pads", "disposing a plurality of LED chips on the circuit substrate, with each of the LED chips being disposed on at least two conductors", "a laser source generated by a laser generation module being directed to each of the LED chips so that the laser source passes through the LED chip and is projected onto the at least two conductors" and "the conductor disposed between the LED chip and the circuit substrate being cured by irradiation of the laser source" so as to mount the LED chip on the circuit substrate.

Another beneficial effect of the present disclosure is that the LED mounted device provided by the present disclosure has the technical features of "a carrier module used to carry a circuit substrate, the circuit substrate including a plurality of conductive pads, and a plurality of conductors being respectively disposed on the conductive pads", "a laser source generated by a laser generation module being directed to each LED chip, so that the laser source passes through the LED chip and is projected onto the at least two conductors", "the carrier module, a pick and place module and the laser generation module being adjacent to each other and disposed on the same production line" and "the conductor disposed between LED chip and circuit substrate being cured by irradiation of laser source" so that the LED chip is mounted on the circuit substrate.

Still another beneficial effect of the present disclosure is that, the LED mounted device provided by the present disclosure has the technical features of "the LED mounted device including a carrier module, a pick and place module and a laser generation module", "the carrier module, the pick and place module and the laser generation module being disposed on the same production line" and "a laser source generated by the laser generation module being directed to an LED chip so that the laser source passes through the LED chip and is projected onto at least two conductors and the conductors being cured by irradiation of the laser source", so that the LED chip 12 is mounted on a circuit substrate 10.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
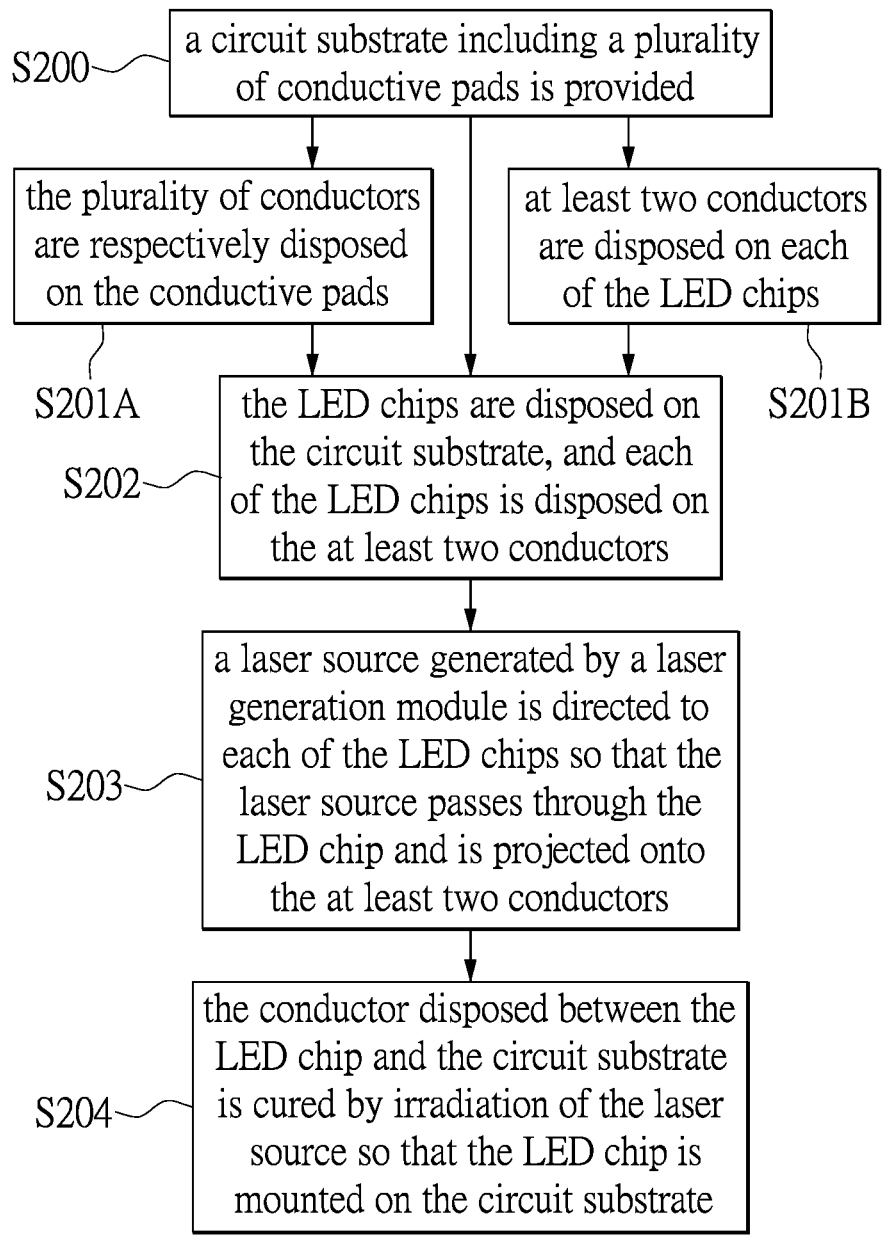
FIG. 1 is flow chart of an LED chip mounting method according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 4, a first embodiment of the present disclosure provides an LED chip mounting method, including the following steps.

Figure 2:
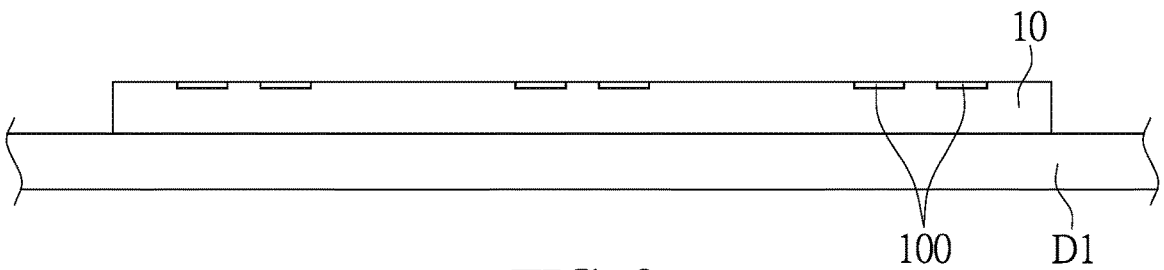
FIG. 2 is a schematic view of step S200 of the LED chip mounting method according to the first embodiment of the present disclosure.

Firstly, as shown in FIG. 1 and FIG. 2, a circuit substrate 10 including a plurality of conductive pads 100 is provided (step S200). For example, in step S200 of the present disclosure, the circuit substrate 10 can be carried by a carrier module D1, and the circuit substrate 10 further includes the plurality of conductive pads 100. The carrier module D1 can be a mounting platform with a displacement function. However, the present disclosure is not limited thereto.

Figure 3:
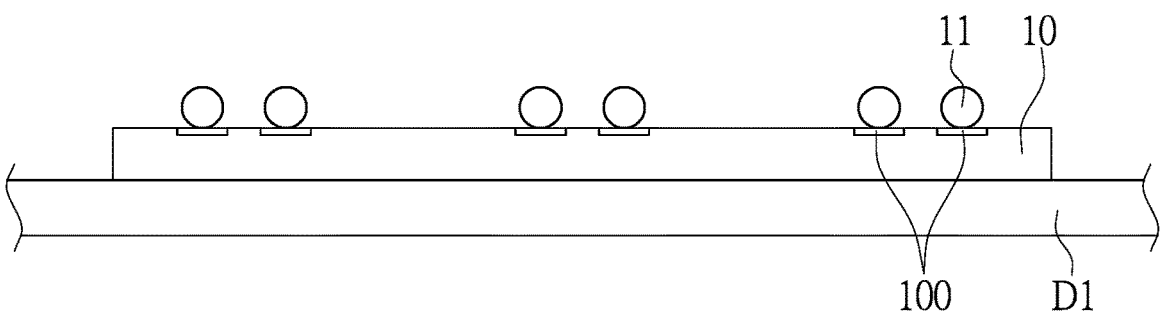
FIG. 3 is a schematic view of step S201 of the LED chip mounting method according to the first embodiment of the present disclosure.

Further, as shown in FIG. 1 and FIG. 3, after the step S200 of providing the circuit substrate 10, the present disclosure further includes: disposing the plurality of conductors 11 on the conductive pads 100, respectively (step S201A). For example, in step S201A of the present disclosure, the at least one conductor 11 may be disposed on each of the conductive pads 100, and the conductor 11 may be a solder ball or other structures made of a conductive material. However, the present disclosure is not limited thereto.

Figure 4:
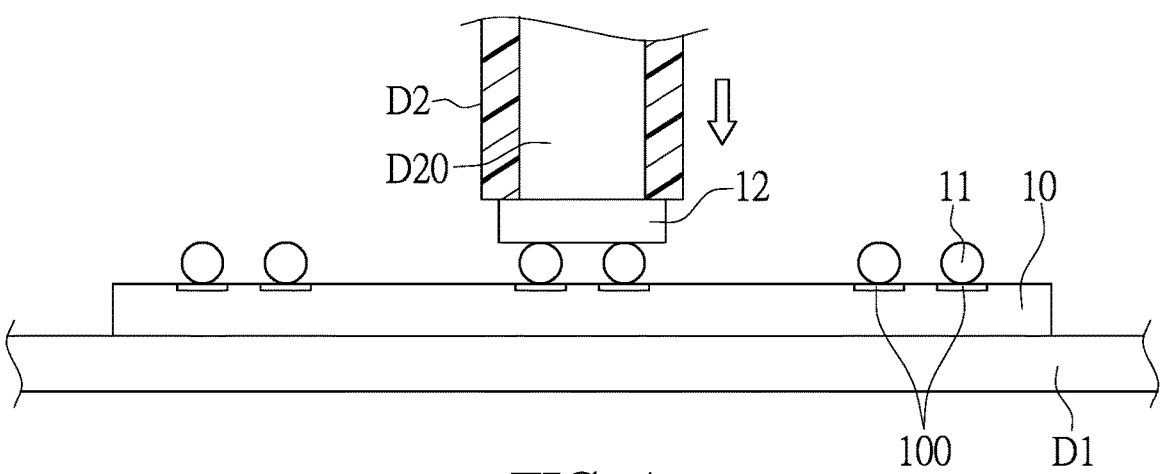
FIG. 4 is a schematic view of step S202 of the LED chip mounting method according to the first embodiment of the present disclosure.

Next, as shown in FIG. 1, FIG. 3, and FIG. 4, a plurality of LED chips 12 are disposed on the circuit substrate 10, and each of the LED chips 12 is disposed on the at least two conductors 11 (step S202).

For example, as shown in FIG. 1, FIG. 3 and FIG. 4, in step S202 of the present disclosure, the plurality of LED chips 12 are placed on the circuit substrate 10 by a pick and place module D2, and each of the LED chips 12 corresponds to the at least two conductors 11. The pick and place module D2 can be a vacuum nozzle or any kind of pick and place machine. However, the present disclosure is not limited thereto.

Then, as shown in FIG. 1 and FIG. 4 to FIG. 7, a laser source L generated by a laser generation module D3 is directed to each of the LED chips 12 so that the laser source L passes through the LED chip 12 and is projected onto the at least two conductors 11 (step S203).

Figure 7:
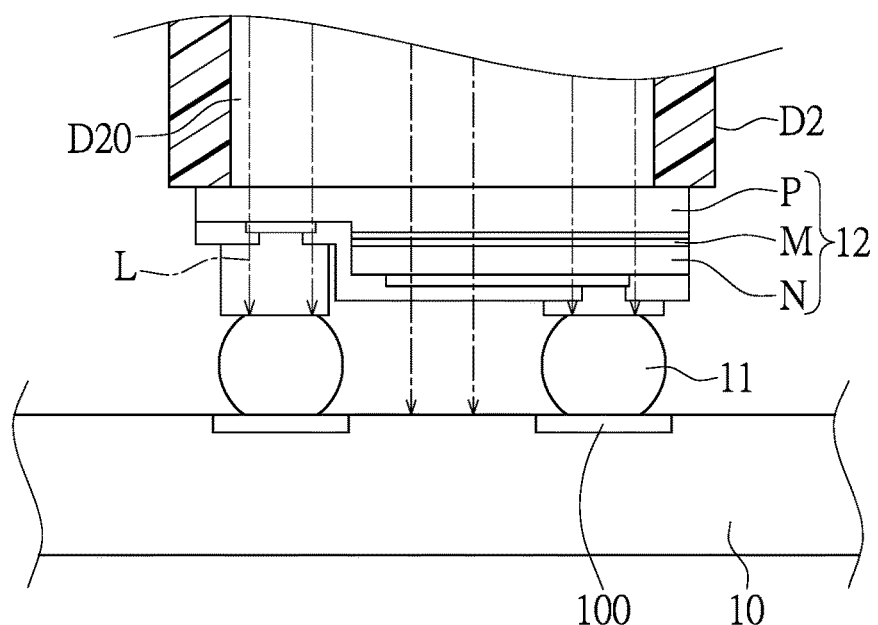
FIG. 7 is an enlarged schematic view showing the LED chip in step S203 of the LED chip mounting method according to the first embodiment of the present disclosure.

For example, as shown in FIG. 1 and FIG. 4 to FIG. 7, after step S202 of the present disclosure, step S203 follows immediately, generating the laser source L through the laser generation module D3, and directing the laser source L to each LED chip 12. When the laser source L is projected onto the LED chip 12, the laser source L passes through an n-type conductive layer N, a light-emitting layer M and a p-type conductive layer P of the LED chip 12, and is projected onto the at least two conductors 11 of the circuit substrate 10. Furthermore, as shown in FIG. 7, each of the LED chips 12 may be a micro-semiconductor light-emitting element (Micro LED) including the n-type conductive layer N, the light-emitting layer M through which the laser light source L passes, and the p-type conductive layer P that are disposed in a stacked arrangement. The n-type conductive layer N may be an n-type gallium nitride material layer or an n-type gallium arsenide material layer, the light-emitting layer M is a multi-quantum well structure layer, and the p-type conductive layer P may be a p-type gallium nitride material layer or a p-type gallium arsenide material layer, but the present disclosure is not limited thereto. However, the above-mentioned examples are only one of the possible embodiments and the present disclosure is not limited thereto.

Figure 8:
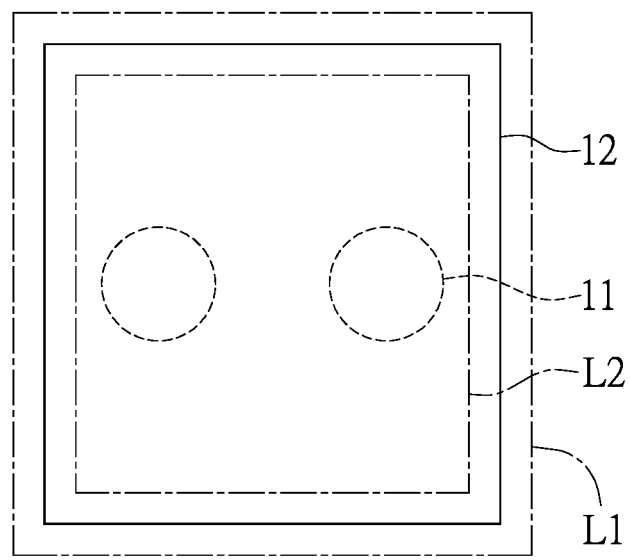
FIG. 8 is a first schematic diagram of a laser source irradiation range in step S203 of the LED chip mounting method according to the first embodiment of the present disclosure.
Figure 9:
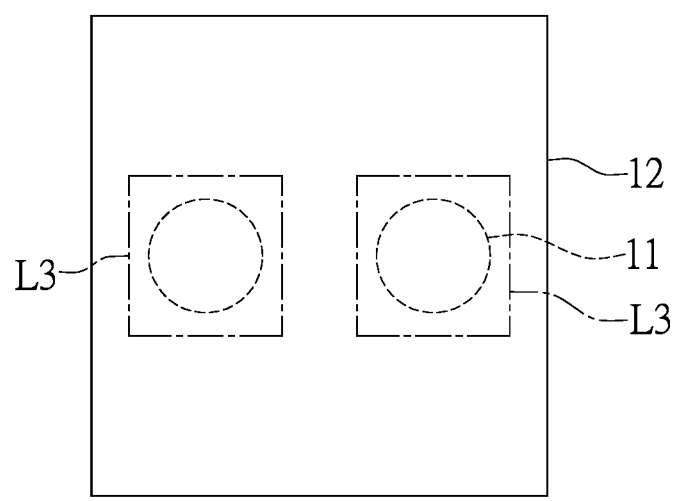
FIG. 9 is a second schematic diagram of a laser source irradiation range in step S203 of the LED chip mounting method according to the first embodiment of the present disclosure.
Figure 10:
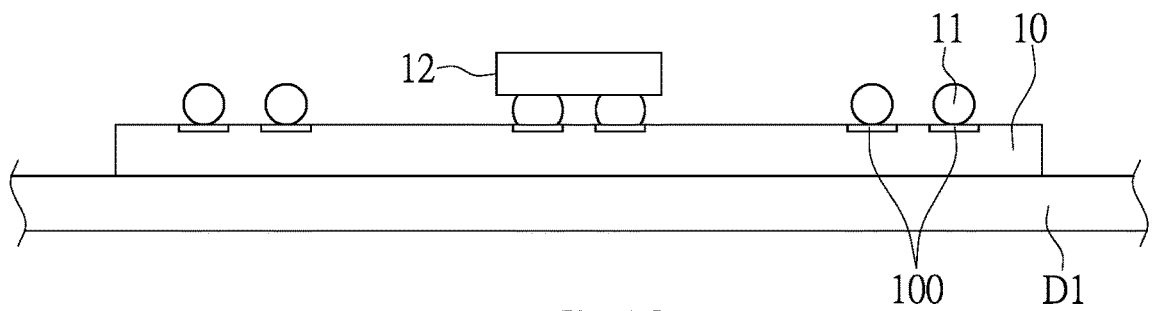
FIG. 10 is a schematic diagram of step S204 of the LED chip mounting method according to the first embodiment of the present disclosure.

Furthermore, as shown in FIG. 8 and FIG. 9, the present disclosure can adjust the laser generation module D3 so that the laser source L generated by the laser generation module D3 is projected onto the conductor 11 through the LED chip 12, and the irradiation range of the laser source L can be in various configurations. For example, as shown in FIG. 8, the irradiation area of the laser source L1 may cover one of the LED chips 12, or the irradiation area of the laser source L2 may cover the at least two conductors 11; or, as shown in FIG. 9, the irradiation area of the laser source L3 may cover only one of the conductors 11. Moreover, the present disclosure can also adjust the laser generation module D3 so that the laser source L generated by the laser generation module D3 only passes through the LED chip 12 and does not pass through the circuit substrate 10.

Figure 5:
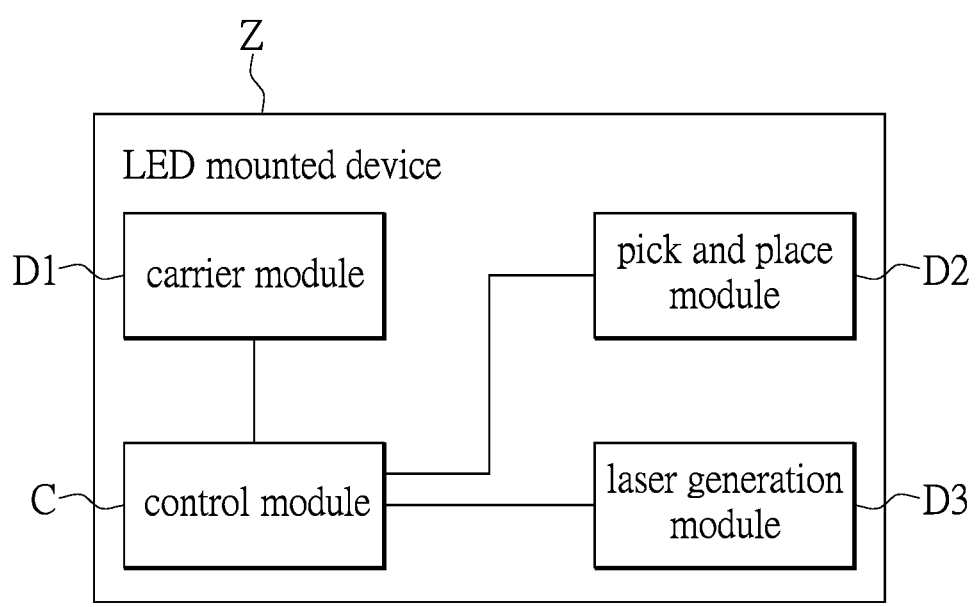
FIG. 5 is a block diagram of the LED mounted device according to the present disclosure.
Figure 6:
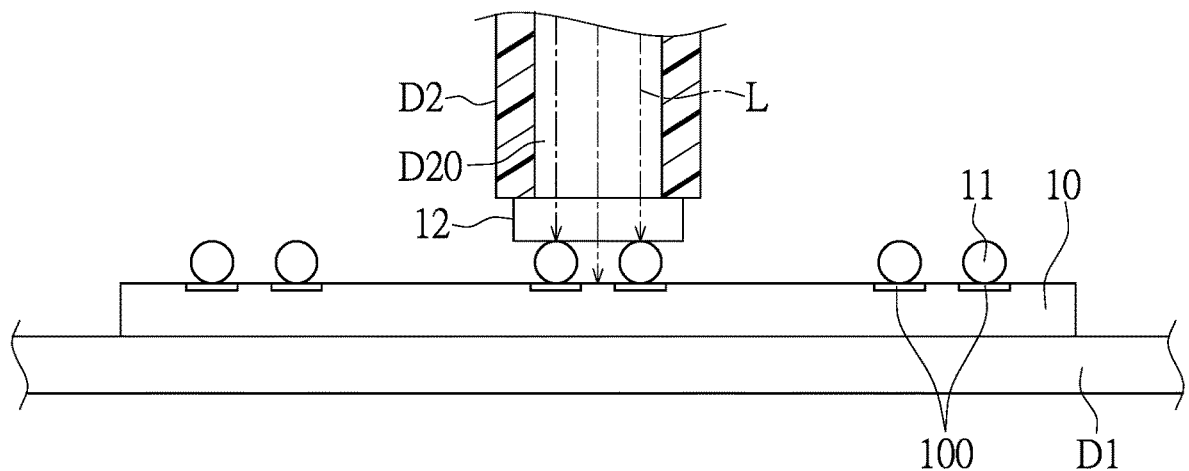
FIG. 6 is a schematic view of step S203 of the LED chip mounting method according to the first embodiment of the present disclosure.

It should be noted that, as shown in FIG. 1 and FIG. 5 to FIG. 7, the pick and place module D2 of the present disclosure may have a gas guiding channel D20, and the laser source L generated by the laser generation module D3 passes through the gas guiding channel D20. Further, in the transitional process between step S203 and step S202, when each of the LED chips 12 is disposed on the circuit substrate 10 by the pick and place module D2, the laser source L generated by the laser generation module D3 can be directed to the LED chip 12 by the gas guiding channel D20 of the pick and place module D2. For example, when the pick and place module D2 places the LED chip 12 on the at least two conductors 11 on the circuit substrate 10, the laser source L generated by the laser generation module D3 is directed to the LED chip 12 through the gas guiding channel D20, thereby irradiating the conductor 11 to thereby allow omission of the step of detecting and positioning the conductor 11. As shown in FIG. 5, the LED chip mounting method and device of the present disclosure can further be electrically connected to the carrier module D1, the pick and place module D2, and the laser generation module D3 through a control module C, and the control module C can drive the modules to operate according to a built-in program or a manipulation of an operator. However, the above-mentioned examples are only one of the possible embodiments and the present disclosure is not limited thereto.

Finally, as shown in FIG. 1 and FIG. 4 to FIG. 10, the conductor 11 disposed between the LED chip 12 and the circuit substrate 10 is cured by irradiation of the laser source L so that the LED chip 12 is mounted on the circuit substrate 10 (step S204).

For example, as shown in FIG. 1 and FIG. 4 to FIG. 10, in step S204 of the present disclosure, when the conductor 11 disposed between the LED chip 12 and the circuit substrate 10 is irradiated by the laser source L, the conductor 11 is softened, and generates a connection with the LED chip 12. Then, after the conductor 11 is cured, the LED chip 12 is mounted on the circuit substrate 10 and electrically connected to the circuit substrate 10 through the conductor 11. However, the present disclosure is not limited thereto.

Second Embodiment

Figure 11:
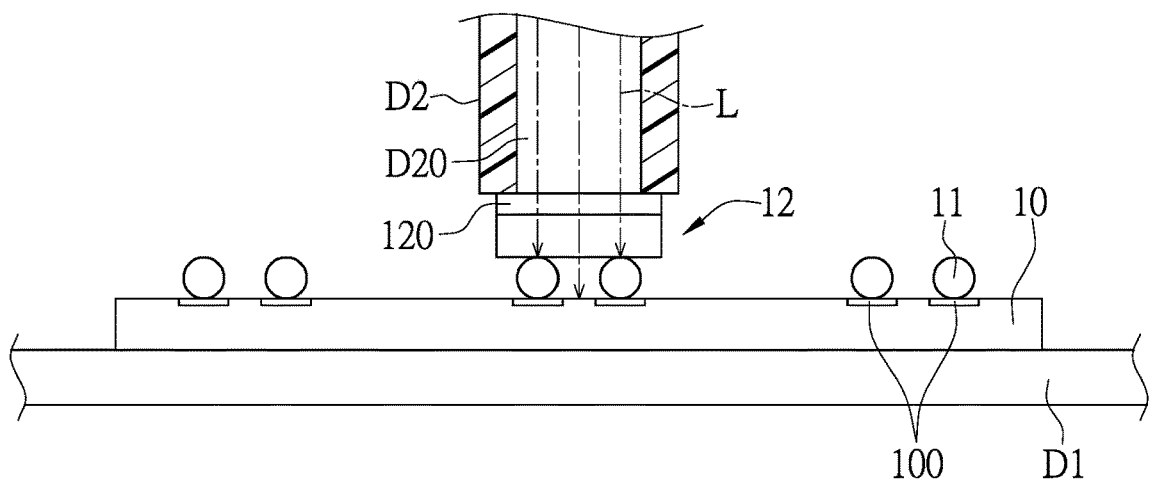
FIG. 11 is a first schematic diagram of the LED chip mounting method according to a second embodiment of the present disclosure.
Figure 12:
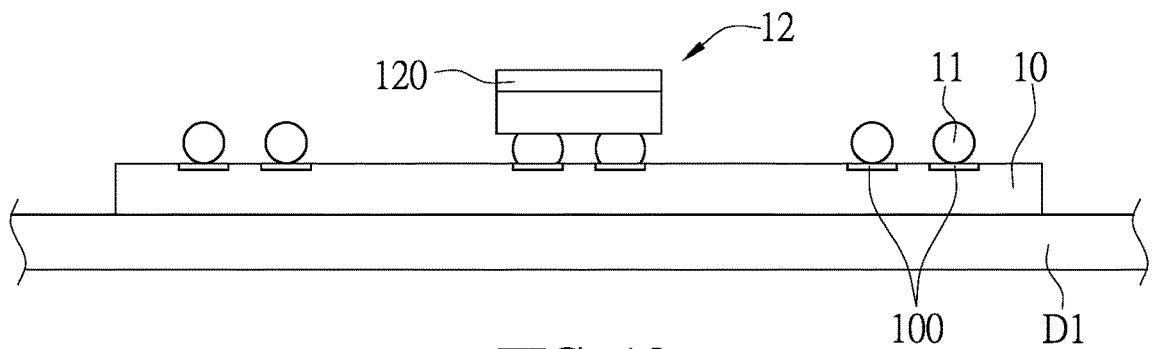
FIG. 12 is a second schematic diagram of the LED chip mounting method according to the second embodiment of the present disclosure.

Referring to FIG. 11 to FIG. 12 together with FIG. 1 to FIG. 10, a second embodiment of the present disclosure provides an LED mounted method that is similar to that described in the first embodiment, and therefore similar steps in the process will not be described again. The difference between the second embodiment and the first embodiment of the present disclosure is that each of the LED chips 12 of the second embodiment may be a sub-millimeter LED (Mini LED) including a base layer 120, an n-type conductive layer N, a light-emitting layer M passing through the laser source L, and a p-type conductive layer P that are disposed in a stacked arrangement. The base layer 120 is a sapphire material layer, and the n-type conductive layer N may be an n-type gallium nitride material layer or n-type arsenic, the light-emitting layer M may be a multi-quantum well structure layer, and the p-type conductive layer P may be a p-type gallium nitride material layer or a p-type gallium arsenide material layer, but the present disclosure is not limited thereto. The base layer 120 may also be a quartz base layer, a glass base layer, a tantalum base layer, or a base layer of any material. However, the above-mentioned examples are only one of the possible embodiments and the present disclosure is not limited thereto.

For example, as shown in FIG. 11, in a step similar to step S203 of the first embodiment, in the second embodiment of the present disclosure, when a laser source L generated by a laser generation module D3 is projected to each of the LED chips 12, the laser source L passes through the base layer 120, the n-type conductive layer N, the light-emitting layer M, and the p-type conductive layer P, and is projected onto at least two conductors 11 of the circuit substrate 10.

Further, as shown in FIG. 12, in a step similar to step S204 of the first embodiment, in the second embodiment of the present disclosure, the conductor 11 disposed between the LED chip 12 and the circuit substrate 10 is cured by irradiation of a laser source L so that the LED chip 12 is mounted on the circuit substrate 10. However, the above-mentioned examples are only one of the possible embodiments and the present disclosure is not limited thereto.

It should be noted that, as shown in FIG. 12, the present disclosure further provides an LED mounted device Z, which includes a carrier module D1, a pick and place module D2, and a laser generation module D3. The carrier module D1, the pick and place module D2, and the laser generation module D3 are disposed on the same production line. A laser source L generated by the laser generation module D3 is directed to an LED chip 12, so that the laser source L passes through the LED chip 12 and is projected onto at least two conductors 11, and the conductors 11 are cured by irradiation of the laser source L so that the LED chip 12 is mounted to a circuit substrate 10.

Furthermore, as shown in FIG. 1 to FIG. 12, the present disclosure can also provide an LED mounted device Z including a carrier module D1, a pick and place module D2, and a laser generation module D3. The carrier module D1 is used to carry a circuit substrate 10 including a plurality of conductive pads 100, and a plurality of conductors 11 are respectively disposed on the conductive pads 100. The pick and place module D2 is for disposing a plurality of LED chips 12 on the circuit substrate 10, and each of the LED chips 12 is disposed on at least two conductors 11. A laser source L generated by the laser generation module D3 is directed to each of the LED chips 12 so that the laser source L passes through the LED chip 12 and is projected onto at least two conductors 11. The carrier module D1, the pick and place module D2, and the laser generation module D3 are adjacent to each other and disposed on the same production line. The conductor 11 disposed between the LED chip 12 and the circuit substrate 10 is cured by irradiation of the laser source L, so that the LED chip 12 is mounted on the circuit substrate 10.

Third Embodiment

Figure 13:
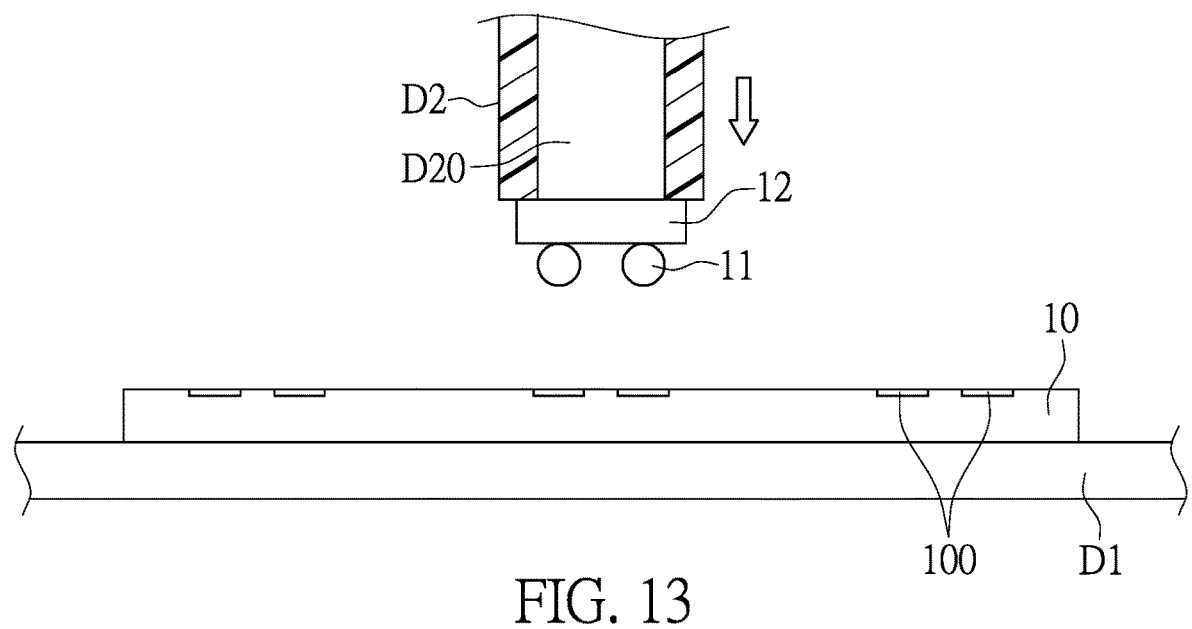
FIG. 13 is a first schematic diagram of the LED chip mounting method according to a third embodiment of the present disclosure.
Figure 14:
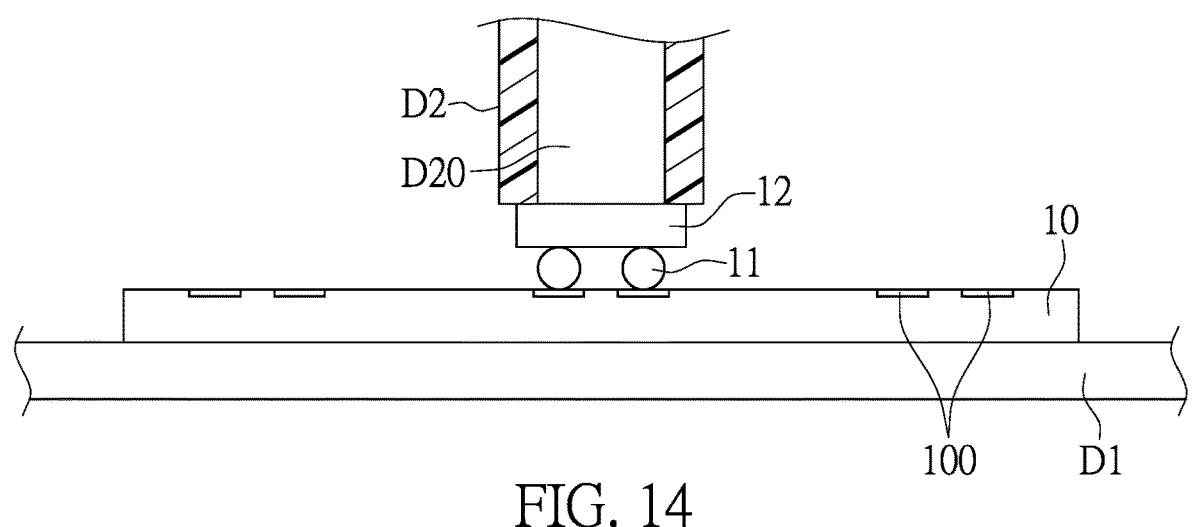
FIG. 14 is a second schematic diagram of the LED chip mounting method according to the third embodiment of the present disclosure.
Figure 15:
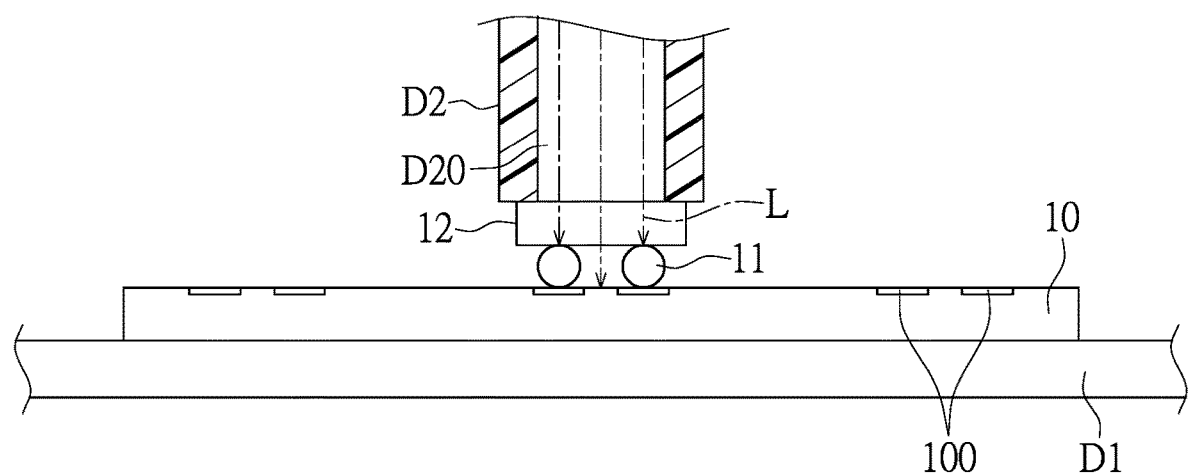
FIG. 15 is a third schematic diagram of the LED chip mounting method according to the third embodiment of the present disclosure.

Referring to FIG. 13 to FIG. 15, together with FIG. 1 to FIG. 10, a third embodiment of the present disclosure provides an LED mounted method that is similar to that described in the first embodiment, therefore similar steps in the process will not be described again. Further, according to FIG. 2 to FIG. 6 and FIG. 13 to FIG. 15, the difference between the third embodiment and the first embodiment of the present disclosure is that, the third embodiment further includes: at least two conductors 11 being disposed on each of the LED chips 12 (step S201B). For example, in step S201B of the present disclosure, the at least two conductors 11 may be disposed on each of the LED chips 12, and the conductor 11 may be a solder ball or other structures made of a conductive material. However, the present disclosure is not limited thereto.

Next, as shown in FIG. 1 to FIG. 10, FIG. 13, FIG. 14 and FIG. 15, a plurality of LED chips 12 are placed on the circuit substrate 10 by the pick and place module M2, and at least two conductors 11 of each of the LED chips 12 correspond to the conductive pad 100 of the circuit substrate 10. Then, the laser source L generated by the laser generation module M3 is directed to the LED chip 12. After that, when the conductor 11 disposed between the LED chip 12 and the circuit substrate 10 is irradiated by the laser source L, the conductor 11 is softened, and generates a connection with the circuit substrate 10. Finally, after the conductor 11 is cured, the LED chip 12 is mounted to the circuit substrate 10 and electrically connected to the circuit substrate 10 through the conductor 11. However, the present disclosure is not limited thereto.

In conclusion, one of the beneficial effects of the present disclosure is that, the LED chip mounting method provided by the present disclosure has the technical features of "providing a circuit substrate 10 including a plurality of conductive pads 100", "disposing a plurality of LED chips 12 on the circuit substrate 10, with each of the LED chips 12 being disposed on at least two conductors 11", "a laser source L generated by a laser generation module D3 being directed to each of the LED chips 12 so that the laser source L passes through the LED chip 12 and is projected onto the at least two conductors 11" and "the conductor 11 disposed between the LED chip 12 and the circuit substrate 10 being cured by irradiation of the laser source L" so as to mount the LED chip 12 on the circuit substrate 10.

Another beneficial effect of the present disclosure is that, the LED mounted device Z provided by the present disclosure has the technical features of "a carrier module D1 used to carry a circuit substrate 10, the circuit substrate 10 including a plurality of conductive pads 100, and a plurality of conductors 11 being respectively disposed on the conductive pads 100", "a laser source L generated by a laser generation module D3 being directed to each LED chip 12, so that the laser source L passes through the LED chip 12 and is projected onto the at least two conductors 11", "the carrier module D1, a pick and place module D2 and the laser generation module D3 being adjacent to each other and disposed on the same production line" and "the conductor 11 disposed between LED chip 12 and circuit substrate 10 being cured by irradiation of the laser source L", so that the LED chip 12 is mounted on the circuit substrate 10.

Still another beneficial effect of the present disclosure is that, the LED mounted device Z provided by the present disclosure has the technical features of "the LED mounted device Z including a carrier module D1, a pick and place module D2 and a laser generation module D3", "the carrier module D1, the pick and place module D2 and the laser generation module D3 being disposed on the same production line" and "a laser source 12 generated by the laser generation module D3 being directed to an LED chip 12 so that the laser source L passes through the LED chip 12 and is projected onto at least two conductors 11, and the conductors 11 being cured by irradiation of the laser source L", so that the LED chip 12 is mounted on a circuit substrate 10.

Furthermore, with the above-mentioned technical features, the LED chip mounting method and device provided by the present disclosure allows the conductor 11 to be directly irradiated by the laser source L through the base layer 120, the n-type conductive layer N, the light-emitting layer M, and the p-type conductive layer P to perform a solid crystal process of the LED chip 12 without removing the base layer 120 of the LED chip 12.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An LED chip mounting device, comprising:
   a carrier module for carrying a circuit substrate including a plurality of conductive pads, and a plurality of conductors being respectively disposed on the conductive pads;
   a pick and place module for disposing a plurality of LED chips on the circuit substrate, and each of the LED chips being disposed on at least two of the conductors; and
   a laser generation module, and that the laser source generated by the laser generation module is directed to each of the LED chips so that the laser source passes through the LED chip and is projected onto at least two of the conductors;
   wherein the carrier module, the pick and place module, and the laser generation module are adjacent to each other and disposed on a same production line;
   wherein the conductor disposed between the LED chip and the circuit substrate is cured by irradiation of the laser source so that the LED chip is mounted on the circuit substrate.

2. The LED chip mounting device according to claim 1, wherein each of the LED chips includes an n-type conductive layer, a light-emitting layer through which the laser source passes, and a p-type conductive layer that are in a stacked arrangement, wherein the n-type conductive layer is an n-type nitrogen gallium material layer or an n-type gallium arsenide material layer, the light-emitting layer is multi-quantum well structure layer, and the p-type conductive layer is a p-type gallium nitride material layer or a p-type gallium arsenide material layer; wherein the pick and place module has a gas guiding channel, and the laser source generated by the laser generation module passes through the gas guiding channel.

3. The LED chip mounting device according to claim 1, wherein each of the LED chips includes a base layer disposed in a stack, an n-type conductive layer, a light-emitting layer through which the laser source passes, and a p-type conductive layer, wherein the base layer is a sapphire base layer, the n-type conductive layer is an n-type gallium nitride material layer or an n-type gallium arsenide material layer, the light-emitting layer is a multi-quantum well structure layer, and the p-type conductive layer is a p-type gallium nitride material layer or a p-type gallium arsenide material layer; wherein the pick and place module has a gas guiding channel, and the laser source generated by the laser generation module passes through the gas guiding channel.

4. An LED mounted device, comprising a carrier module, a pick and place module, and a laser generation module, wherein the carrier module, the pick and place module, and the laser generation module are disposed on a same production line, and a laser source generated by the laser generation module is directed to an LED chip so that the laser source passes through the LED chip and is projected onto at least two conductors, and the conductor is cured by irradiation of the laser source, so that the LED chip is mounted on a circuit substrate.

5. The LED mounted device according to claim 4, wherein each of the LED chips includes an n-type conductive layer, a light-emitting layer through which the laser source passes, and a p-type conductive layer that are in a stacked arrangement, wherein the n-type conductive layer is an n-type nitrogen gallium material layer or an n-type gallium arsenide material layer, the light-emitting layer is multi-quantum well structure layer, and the p-type conductive layer is a p-type gallium nitride material layer or a p-type gallium arsenide material layer; wherein the pick and place module has a gas guiding channel, and the laser source generated by the laser generation module passes through the gas guiding channel.

6. The LED mounted device according to claim 4, wherein each of the LED chips includes a base layer, an n-type conductive layer, a light-emitting layer through which the laser source passes, and a p-type conductive layer that are in a stacked arrangement, wherein the base layer is a sapphire base layer, the n-type conductive layer is an n-type gallium nitride material layer or an n-type gallium arsenide material layer, the light-emitting layer is a multi-quantum well structure layer, and the p-type conductive layer is a p-type gallium nitride material layer or a p-type gallium arsenide material layer; wherein the pick and place module has a gas guiding channel, and the laser source generated by the laser generation module passes through the gas guiding channel.

\* \* \* \* \*